(12) United States Patent
Pommer

(10) Patent No.: US 6,246,014 B1
(45) Date of Patent: *Jun. 12, 2001

(54) PRINTED CIRCUIT ASSEMBLY AND METHOD OF MANUFACTURE THEREFOR

(75) Inventor: Richard John Pommer, Trabuco Canyon, CA (US)

(73) Assignee: Honeywell International Inc., Morris Township, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,241

(22) Filed: Jul. 24, 1998

Related U.S. Application Data

(62) Division of application No. 08/583,645, filed on Jan. 5, 1996, now Pat. No. 5,839,188.

(51) Int. Cl.$^7$ ...................................................... H05K 3/36
(52) U.S. Cl. .......................... 174/261; 174/254; 174/255; 174/259; 257/700; 361/784
(58) Field of Search ..................................... 174/255, 257, 174/265, 254, 259, 261, 267; 257/700; 361/748, 750, 784, 790, 792, 803; 428/209, 343, 356, 901; 29/830

(56) References Cited

U.S. PATENT DOCUMENTS

| Re. 35,064 | 10/1995 | Hernandez | 361/763 |
|---|---|---|---|
| 2,692,190 | 10/1954 | Pritikin | 216/20 |
| 2,721,822 | 10/1955 | Pritikin | 156/150 |
| 3,181,986 | 5/1965 | Pritikin | 156/233 |
| 3,350,498 | 10/1967 | Leeds | 174/544 |
| 3,475,213 | 10/1969 | Stow | 428/328 |
| 3,680,037 | 7/1972 | Nellis et al. | 435/391 |

(List continued on next page.)

FOREIGN PATENT DOCUMENTS

| 2 407 738 | 8/1974 | (DE) . |
|---|---|---|
| 0 270 067 A2 | 12/1986 | (EP) . |
| 0 265 212 | 4/1988 | (EP) . |
| 0 330 452 A2 | 8/1989 | (EP) . |
| 0 379 736 A1 | 8/1990 | (EP) . |
| 0 477 004 A2 | 3/1992 | (EP) . |
| 0 607 534 A2 | 7/1994 | (EP) . |
| 56-68579 | 6/1981 | (JP) . |
| 3-196650 | 8/1991 | (JP) . |
| 3-209734 | 9/1991 | (JP) . |
| 3-218030 | 9/1991 | (JP) . |
| 4-133386 | 5/1992 | (JP) . |
| 4-317663 | 11/1992 | (JP) . |
| 3-231216 | 2/1993 | (JP) . |
| 5-48230 | 2/1993 | (JP) . |

*Primary Examiner*—Albert W. Paladini
(74) *Attorney, Agent, or Firm*—Curtis B. Brueske

(57) ABSTRACT

A printed circuit assembly and method of making the same utilize in one embodiment an adhesive layer including a plurality of non-conductive "gauge particles" disposed within a non-conductive adhesive. When the adhesive layer is disposed between opposing printed circuit layers (be they insulating substrates, conductive layers, or other layers), individual gauge particles are interposed or sandwiched at various points between the layers such that the diameters of the particles control the layer separation throughout overlapping areas of thereof, thereby permitting careful control over layer separation. A printed circuit assembly and method of making the same utilize in another embodiment an interlayer interconnecting technology incorporating conductive posts that are deposited on one of a pair of contact pads formed on opposing printed circuit boards and thereafter bonded to the other in the pair of contact pads during lamination. Fusible material may be utilized in the conductive posts to facilitate mechanical bonding to a contact pad, and the posts project through a dielectric layer disposed between the printed circuit boards, thereby forming the electrical connections between the boards at discrete locations.

12 Claims, 4 Drawing Sheets

U.S. PATENT DOCUMENTS

| | | | | |
|---|---|---|---|---|
| 3,823,252 | | 7/1974 | Schmid | 174/257 |
| 3,835,531 | | 9/1974 | Luttmer | 29/843 |
| 3,982,320 | | 9/1976 | Buchoff et al. | 29/883 |
| 3,986,255 | | 10/1976 | Mandal | 29/860 |
| 4,064,623 | | 12/1977 | Moore | 29/876 |
| 4,157,932 | | 6/1979 | Hirata | 156/310 |
| 4,159,222 | | 6/1979 | Lebow et al. | 216/20 |
| 4,174,331 | | 11/1979 | Myles | 524/338 |
| 4,268,849 | * | 5/1981 | Gray et al. | 257/745 |
| 4,545,840 | * | 10/1985 | Newman et al. | 156/276 |
| 4,604,644 | | 8/1986 | Beckham et al. | 257/737 |
| 4,667,220 | * | 5/1987 | Lee et al. | 257/700 X |
| 4,771,159 | | 9/1988 | O'Leary | 219/85.22 |
| 4,778,635 | | 10/1988 | Hechtman et al. | 264/437 |
| 4,814,040 | | 3/1989 | Ozawa | 216/20 |
| 4,908,258 | | 3/1990 | Hernandez | 428/198 |
| 4,991,285 | | 2/1991 | Shaheen et al. | 29/830 |
| 5,001,302 | | 3/1991 | Atsumi | 174/94 R |
| 5,038,251 | | 8/1991 | Sugiyama et al. | 361/680 |
| 5,041,183 | | 8/1991 | Nakamura et al. | 156/264 |
| 5,046,238 | | 9/1991 | Daigle et al. | 28/830 |
| 5,060,844 | | 10/1991 | Behun et al. | 228/180.21 |
| 5,093,986 | | 3/1992 | Mandai et al. | 29/843 |
| 5,112,464 | | 5/1992 | Tsou et al. | 204/230.2 |
| 5,137,791 | | 8/1992 | Swisher | 428/612 |
| 5,147,084 | | 9/1992 | Behun et al. | 228/56.3 |
| 5,154,341 | | 10/1992 | Melton et al. | 228/180.22 |
| 5,203,075 | | 4/1993 | Angulas et al. | 29/830 |
| 5,225,966 | | 7/1993 | Basavanhally et al. | 361/774 |
| 5,235,741 | | 8/1993 | Mase | 29/820 |
| 5,261,593 | | 11/1993 | Casson et al. | 228/180.22 |
| 5,318,651 | | 6/1994 | Matsui et al. | 156/273.5 |
| 5,324,569 | | 6/1994 | Nagesh et al. | 428/198 |
| 5,329,695 | | 7/1994 | Traskos et al. | 29/830 |
| 5,346,118 | | 9/1994 | Degani et al. | 228/180.22 |
| 5,346,775 | | 9/1994 | Jin et al. | 428/614 |
| 5,364,707 | | 11/1994 | Swisher | 428/612 |
| 5,376,403 | | 12/1994 | Capote et al. | 427/96 |
| 5,401,913 | | 3/1995 | Gerber et al. | 174/264 |
| 5,409,157 | | 4/1995 | Nagesh et al. | 228/180.22 |
| 5,429,293 | | 7/1995 | Bradley, III et al. | 228/180.22 |
| 5,431,571 | | 7/1995 | Hanrahan et al. | 439/91 |
| 5,435,732 | | 7/1995 | Angulas et al. | 439/67 |
| 5,439,162 | | 8/1995 | George et al. | 228/180.22 |
| 5,445,308 | | 8/1995 | Nelson et al. | 228/121 |
| 5,450,290 | | 9/1995 | Boyko et al. | 361/792 |
| 5,457,881 | | 10/1995 | Schmidt | 29/852 |
| 5,468,655 | | 11/1995 | Greer | 438/15 |
| 5,492,266 | | 2/1996 | Hoebener et al. | 228/248.1 |
| 5,497,938 | | 3/1996 | McMahon et al. | 228/253 |
| 5,502,889 | * | 4/1996 | Casson et al. | 174/259 X |
| 5,538,789 | | 7/1996 | Capote et al. | 428/344 |
| 5,545,281 | | 8/1996 | Matsui et al. | 156/273.7 |
| 5,600,103 | * | 2/1997 | Odaira et al. | 174/265 |
| 5,736,681 | * | 4/1998 | Yamamoto et al. | 174/265 |

* cited by examiner

PRINTED CIRCUIT ASSEMBLY AND METHOD OF MANUFACTURE THEREFOR

This Application is a division of Ser. No. 08/583,645, filed Jan. 5, 1996 now U.S. Pat. No. 5,839,188.

FIELD OF THE INVENTION

The invention relates to printed circuit assemblies and methods of manufacture therefor. More particularly, the invention relates to printed circuit assemblies and methods of manufacture thereof having controlled separations between conductive layers, and to printed circuit assemblies and methods of manufacture thereof in which multiple overlapping conductive layers are electrically interconnected.

BACKGROUND OF INVENTION

As the complexity and data processing speeds of electronic products continue to increase, the properties of the interconnecting circuitry which connects complex and high speed integrated circuit devices become more pronounced and must be carefully analyzed to ensure reliable circuit performance. Often, it is the increases in complexity and data processing speeds of integrated circuit devices that dictate performance improvements in the interconnecting circuitry to which the devices are mounted.

For example, the complexity of integrated circuit devices, and in particular the advent of surface mount technologies, dictate that greater densities of signal traces be packed into smaller packages to reduce costs and improve reliability. Signal trace widths and spacing has decreased to accommodate higher densities. Moreover, greater densities may be obtained with double- sided and multilayer printed wiring boards having multiple conductive layers that are typically electrically connected via conductive through holes.

Signal trace width and spacing, as well as through hole width and spacing, significantly impact the packaging density obtainable with interconnecting circuitry, and consequently, much development efforts are directed to interconnection technologies that decrease these minimum dimensions to permit greater packaging densities without compromising reliability or performance.

Some of these development efforts are related to the interlayer interconnection of overlapping conductive layers across dielectric layers, where it is desirable to decrease the size of the interconnects across the dielectric layers, while reducing manufacturing costs and complexities. For example, conductive through holes may be drilled and plated through multiple layers to form interlayer connections. However, drilled through holes occupy significant space on a printed circuit board, both because the through holes are formed through the entire board, regardless of which layers need be interconnected, and because most mechanical drilling processes are typically limited to holes with about 100 micron minimum diameters. Anisotropic adhesives are another alternative for forming interlayer connections; however, some anisotropic adhesives do not form pure metallurgical joints, and thus may suffer from a reliability standpoint. Further, they often require coverlayers to insulate nonconnected but overlapping conductive areas, thus increasing overall assembly thicknesses.

Therefore, a significant need continues to exist for a reliable interlayer interconnection technology which is compatible with the continuing drive to increase packaging densities in interconnecting circuitry.

As was also noted above, the data processing speeds obtainable with advanced high speed integrated circuit devices also dictate the required characteristics of the interconnecting circuitry used to connected such devices. Currently, integrated circuit devices may operate with a throughput in gigabits per second, resulting in pulse durations of less than a nanosecond and rise times in the picosecond range. Under these conditions, the conductors connecting these devices become active components in the circuits, both in terms of affecting propagation delays and impedance matching.

Propagation delays are affected by interconnecting circuitry such as printed circuit boards and assemblies principally as a result of the dielectric constant of the materials used in the circuitry. In particular, materials having low dielectric constants are desirable to use for minimizing any propagation delays, and thereby increasing the range of obtainable signal speeds within a circuit.

Impedance is principally the combination of resistance, capacitance and inductance which create electric and magnetic fields in a circuit. The impedance of a circuit is also called the characteristic impedance, as it depends solely on the characteristics of the materials used and their spatial relationship. Factors such as the dielectric constants of circuitry materials and lengths and widths of conductive signal traces primarily affect the characteristic impedance of an electronic circuit.

Matching the impedances of interconnecting circuitry with other electronic devices and connectors is important for ensuring signal integrity in a circuit. This is because, at high frequencies, signals may get reflected when impedance mismatches are present in a circuit. Such mismatches distort signals, increase rise times, and otherwise generate errors in data transmission. Consequently, impedance matching is often necessary to provide maximum power transfer between the connected electronic components and systems and to prevent signal reflections from forming along the signal paths.

As noted above, impedance in a printed circuit is directly related to the separation between signal traces separated by an insulating layer, as well as to the dielectric constant of the material in the insulating layer. One controlled impedance design is the surface microstrip configuration, where a signal trace opposes a ground plane, with no other overlapping conductive layers. Another is the stripline configuration, where a signal trace is sandwiched between a pair of ground planes.

Controlled impedance requires that both the dielectric constant of the insulating layer, and the separation between the signal traces, to be carefully controlled. For many conventional double-sided printed circuit assemblies, this may not be a significant problem because insulating substrates such as polymer films and hardboards can usually be manufactured with carefully controlled thicknesses and dielectric constants.

However, for many multilayer printed circuit assemblies (i.e., those with three or more conductive layers), impedance control is more difficult, typically because of the adhesives commonly used in the interlayer interconnection technologies that bond individual single- or double-sided boards together when forming such assemblies. A similar problem may also exist for some two layer boards, e.g., those with opposing single sided boards connected through adhesives.

The problem with such adhesives principally stems from the inability to control the separation between the opposing conductive layers during and after compression or lamination of the assembly, as most of the adhesives are designed to flow somewhat during lamination and fill in gaps between boards. As a result, it becomes difficult to obtain controllable separation throughout a printed circuit assembly. Additional problems may arise from imperfect or uncontrolled deposition of the conductive layers and any intervening coverlayers, resulting in varying thicknesses in these layers.

Another important concern with many multilayer printed circuit assemblies is planarity. In particular, it may be important to maintain controlled thicknesses of layers, even in non-impedance critical applications, so that outer surfaces of an assembly are substantially planar. This may be important, for example, when populating an assembly with integrated circuit and other electronic devices, since connecting pads on the assembly for mounting these devices should have similar elevations to ensure reliable connections there between. However, given the more compactible nature of insulating substrates and adhesives as compared to conductive material, lamination of such assemblies may induce non-planarity. Further, the effects are cumulative with the number of layers, and consequently, the effects may be more pronounced in thicker multilayer assemblies.

One type of interlayer interconnection technology used to bond together opposing conductive layers is the aforementioned anisotropic adhesive, which typically contains conductive particles disposed in a non-conductive adhesive. An anisotropic adhesive, when layered between opposing conductive layers, is designed to conduct only across its thickness and not between different points within the layer. The anisotropic nature of the adhesive permits it to be layered throughout overlapping portions of conductive layers to both bond the layers together and electrically connect any opposing contact pads formed in the conductive layers.

Some anisotropic adhesives utilize conductive particles such as metal-coated polymeric or glass spheres, and some may further include additional non-conductive particles that prevent excess deformation of the conductive particles during lamination. Also, some of these particles are intended to be disposed in a single layer such that opposing contact pads connected by the particles are separated by a distance equal to the diameters of the particles.

While such particles may control the separation between the electrically connected contact pads in some applications, they are not suitable for controlling the separation between conductive layers throughout an entire circuit assembly, particularly in areas where overlapping conductive portions in the layers are not electrically connected across the adhesive layer. Instead, in areas where overlapping pads or traces of conductive material are not electrically connected, a coverlayer is used (which also has the disadvantage of increasing the overall assembly thickness), or one or both conductive layers in the overlapping areas are somewhat recessed, such that the conductive particles are not capable of abutting both conductive layers directly. Otherwise, undesired electrical connections would be formed in those overlapping areas.

Also, since interlayer electrical connections between opposing conductive layers generally take up a relatively small area of a printed circuit assembly, the conductive particles in anisotropic adhesives are not suitable for controlling the separation between conductive layers in most of an assembly. Furthermore, when dealing with a signal layer opposing one or more ground planes, as is found in many controlled impedance applications, the electrical connections between the signal layer and the ground planes may be quite sparse and widely separated, further minimizing the ability of such adhesives to effectively control layer separation throughout relatively large areas of the printed circuit assembly.

Therefore, a substantial need has also existed for a manner of bonding printed circuit layers to one another with a highly controllable separation throughout opposing portions thereof. Moreover, a substantial need has arisen for a manner of bonding printed circuit layers with controlled separation which do not rely solely on the interlayer electrical connection points between opposing layers to control layer separation.

SUMMARY OF INVENTION

The invention addresses these and other problems associated with the prior art in providing a printed circuit assembly and method of making the same which in one aspect utilizes an adhesive layer including a plurality of nonconductive "gauge particles" disposed within a nonconductive adhesive. When the adhesive layer is interposed between opposing printed circuit layers, individual gauge particles are interposed or sandwiched at various points between the printed circuit layers such that the diameters of the particles control the separation between the circuit layers throughout the assembly.

By "printed circuit layer", what is meant is any layer within a printed circuit assembly, whether conductive or non-conductive, and irrespective of its manner of deposition or placement on the assembly. Thus, a "printed circuit layer" may include conductive layers formed of metals or conductive polymers, flexible or rigid substrates, coverlayers, films, etc. Preferably, a "printed circuit layer" will be substantially non-deformable, so that any gauge particles abutting the layer will not substantially deform the layer, but will instead control its relative position within the assembly.

Moreover, it will be appreciated that using gauge particles to control the separation between circuit layers may also de facto control the separation between other circuit layers in the assembly which do not abut the gauge particles, but which are connected in some manner to the circuit layers which do abut the particles. Thus, it will be appreciated that control of this separation may be obtained consistent with the invention not only by interposing the gauge particles between the conductive layers, but also between one conductive layer and another layer to which the other conductive layer is attached (e.g., an insulating substrate), as well as between two such layers to which the conductive layers are attached (e.g., between two insulating substrates). Other combinations may also be used consisted with the invention.

The particles in the adhesive layer are designated "gauge" particles because they determine or control the separation between opposing printed circuit layers in a manufactured assembly. Furthermore, the particles are constructed to be non-conductive, such that a particle may be oriented at practically any point between opposing printed circuit layers irrespective of the materials used in the opposing layers, and irrespective of whether an electrical connection has or is to be formed at this point.

The invention addresses additional problems associated with the prior art in providing a printed circuit assembly and method of making the same which in another aspect interconnects contact pads on an overlapping pair of conductive layers through conductive posts formed on the contact pads on one layer and bonded to the contact pads on the other layer. Fusible material may be incorporated into the posts to form fused connections with the opposing contact pads. The posts may project through apertures in a dielectric layer separating the conductive layers, or alternately, the posts may "pierce" through the dielectric layer during lamination, thereby eliminating a separate aperture-formation step.

Therefore, in accordance with one aspect of the invention, there is provided a printed circuit assembly, which includes first and second printed circuit boards, each printed circuit board including an insulating substrate with a conductive layer disposed thereon, the conductive layer on the first printed circuit board including a first contact pad opposing a second contact pad on the conductive layer on the second printed circuit board, and at least one of the first and second printed circuit boards including a second conductive layer formed on the opposite surface of the insulating substrate; a dielectric layer disposed between the first and second printed circuit boards; and a conductive post, formed on the first contact pad, the conductive post extending across the dielectric layer and abutting the second contact pad, thereby electrically connecting the first and second contact pads.

In accordance with another aspect of the invention, there is provided a method of manufacturing a printed circuit assembly. The method includes the step of forming a conductive post on a first printed circuit board, the printed circuit board including an insulating substrate with a conductive layer disposed thereon, wherein the conductive post is disposed on a first contact pad disposed in the conductive layer of the first printed circuit board; placing a second printed circuit board over the first printed circuit board with a second contact pad aligned with the conductive post and with a dielectric layer disposed therebetween, the second printed circuit board including an insulating substrate with a conductive layer disposed thereon, wherein the second contact pad is disposed in the conductive layer of the second printed circuit board, and wherein at least one of the first and second printed circuit boards includes a second conductive layer formed on the opposite surface of the insulating substrate; and compressing the first and second printed circuit boards together until the conductive post extends across the dielectric layer and abuts the second contact pad, thereby electrically connecting the first and second contact pads.

These and other advantages and features, which characterize the invention, are set forth in the claims annexed hereto and forming a further part hereof. However, for a better understanding of the invention, and of the advantages and objectives attained by its use, reference should be made to the Drawing, and to the accompanying descriptive matter, in which there is described preferred embodiments of the invention.

DETAILED DESCRIPTION OF THE PREFERRED EMBODIMENTS

The invention incorporates two primary aspects. The first deals with controlling the separation between opposing printed circuit layers in a printed circuit assembly. The second deals with forming interlayer interconnections between opposing conductive layers in a printed circuit assembly. While both aspects of the invention are useful when used in conjunction with one another, it should be appreciated that neither aspect should be limited to use only in conjunction with the other.

Controlled Separation

Figure 1:
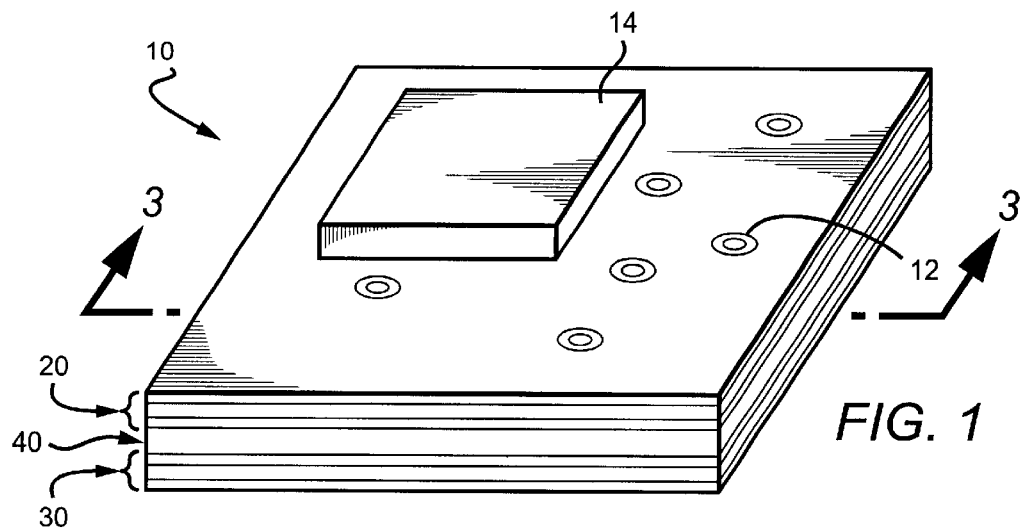
FIG. 1 is a perspective view of one preferred printed circuit assembly consistent with the principles of the invention.

Turning to the Drawing, wherein like numbers denote like parts throughout the several views, FIG. 1 shows a preferred printed circuit assembly 10 consistent with the principles of the present invention. Assembly 10 generally includes a pair of double- sided printed circuit boards 20, 30 joined by an adhesive layer 40.

One principle benefit of the invention is the ability to reliably control circuit layer separations through the use of an adhesive layer having gauge particles dispersed therein. Controlled layer separation may be beneficial for controlling impedance, as well as to ensure planarity throughout an assembly.

In general, preferred embodiments of the invention operate by interposing controlled diameter gauge particles between opposing or overlapping portions of printed circuit layers and compressing the circuit layers such that the particles abut both opposing layers and thereby define the separation therebetween. Moreover, considering the stability and non-deformability of many printed circuit materials, controlling the separation between printed circuit layers also controls the separation between other layers connected thereto. This also has the effect of minimizing any additive planarity distortions in a multiple layer printed circuit assembly.

The gauge particles may be interposed between any two opposing printed circuit layers, which as discussed above may include numerous materials, including conductive layers formed of metals or conductive polymers, flexible or rigid substrates, coverlayers, films, etc. These layers are preferably substantially non-deformable so that they will abut the particles but will not substantially deform or compress at their point of abutment with the particles, to thereby fix their relative separations in the assembly.

Figure 2:
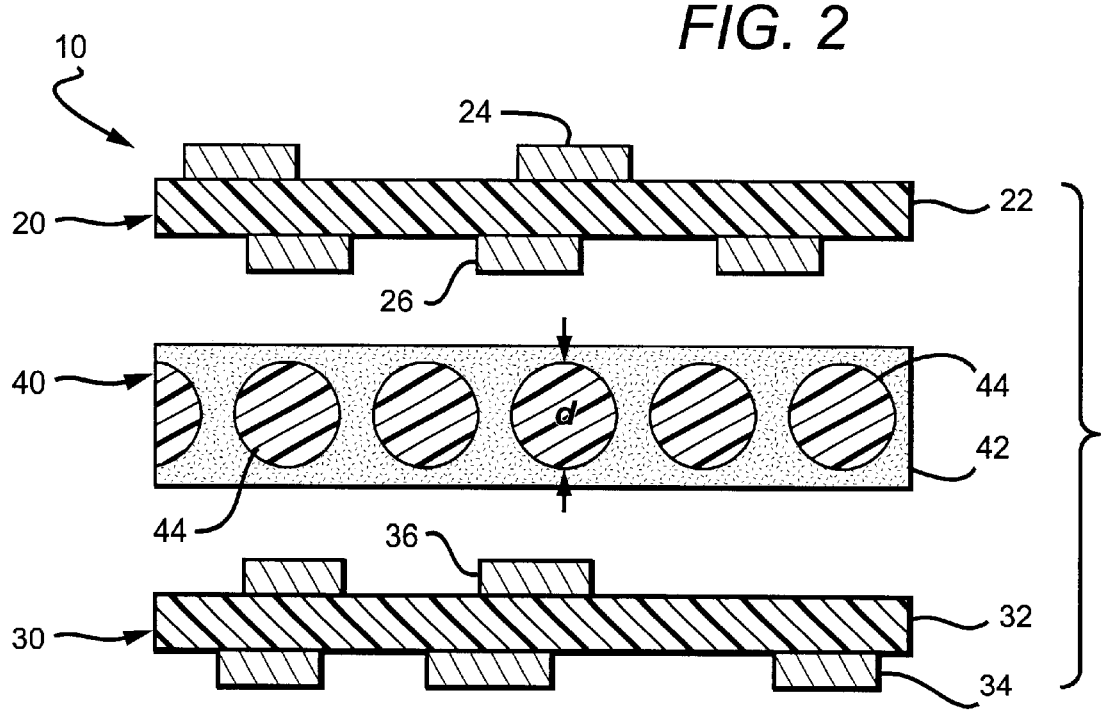
FIG. 2 is an exploded cross-sectional view of a preferred printed circuit assembly of FIG. 1.
Figure 3:
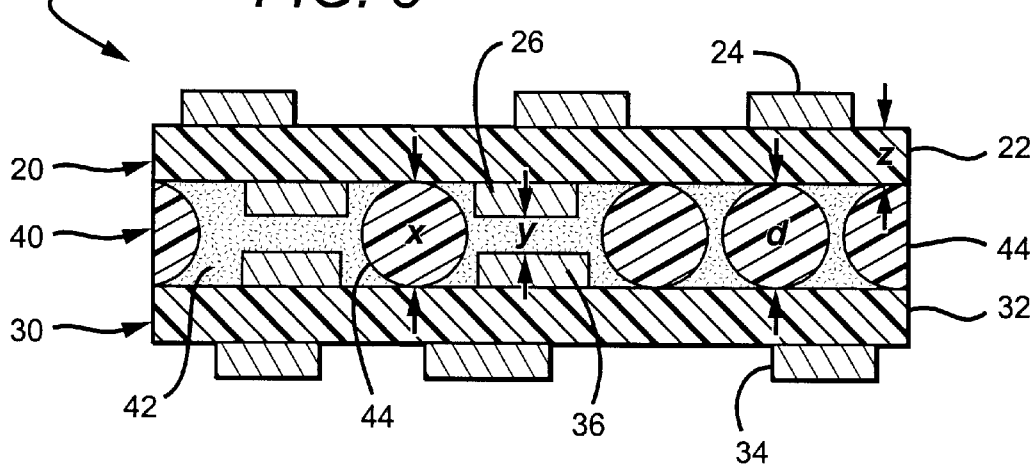
FIG. 3 is a cross-sectional view of a preferred printed circuit assembly, taken through line 3—3 of FIG. 1

For example, one preferred embodiment of the invention, printed circuit assembly 10 shown in FIGS. 1–3, utilizes gauge particles which are sized to abut opposing insulating substrates. With conductive layers mounted to the substrates, the separation between the conductive layers is also controlled, which may be important for impedance control, as well as form maintaining planarity throughout the assembly. Assembly 10 generally includes a pair of printed circuit boards 20, 30 joined by an adhesive layer 40. Also shown are a plurality of through holes 12 joining the opposing conductive layers on each circuit board, as well as an integrated circuit chip 14, which is one of innumerable types of electronic devices that may be populated on assembly 10.

As shown in FIG. 2, printed circuit board 20 includes an insulating substrate 22 with opposing conductive layers 24 and 26. Similarly, printed circuit board 30 includes an insulating substrate 32 with opposing conductive layers 34, 36. Insulating substrates 22, 32 may be any type of flexible or rigid dielectric material suitable for use as a substrate, including polyimide, polyester, PEN, polyetherimide, epoxy, ceramic, impregnated woven or nonwoven glass, among others. Conductive layers 24, 26, 34, 36 are preferably deposited and patterned on substrates 22 and 32 in any manner generally known in the art, including various additive, semi-additive or subtractive techniques. Deposition of the conductive layers may be performed via adhesiveless processes such as vacuum metallization, sputtering, ion plating, chemical vapor deposition, electroplating, electroless plating, etc., as well as through the use of adhesives. The conductive layers may be formed of single metal layers or composite layers formed by different processes, and may include metals such as copper, gold, chromium, aluminum, palladium, tin, etc., as well as conductive polymers and the like.

In the preferred embodiment, substrates 22, 32 are formed of polyimide, and conductive layers 24, 26, 34, 36 are formed via the NOVACLAD process, which is the subject matter of U.S. Pat. Nos. 5,112,462; 5,137,791 and 5,364,707 to Swisher, and assigned to Sheldahl, Inc. process generally includes the steps of (1) treating the substrate with a plasma made up of ionized oxygen produced from a metallic electrode to form a metal/oxide treated film and (2) forming metallized interconnection layers on the treated film, preferably either by vacuum metallization of metal, or by combination of vacuum metallization of metal and an additional step of electroplating metal on top of the vacuum-deposited metal. The first step in the process produces a bonding surface on the film which is capable of securing metal interconnection layers which, unlike adhesive-based substrates, have excellent delamination resistance, especially when exposed to heat, chemical treatment, mechanical stress or environmental stress board, thus metallized, may be etched in a conventional manner to form the desired circuit patterns in the conductive layers.

Through holes may be formed on printed circuit boards 20, 30 e.g., by drilling vies in the substrate prior to metallization such that conductive material is deposited thereon. It some applications the conductive material deposited on the via walls may completely fill the vies, such that no aperture remains within the through hole. Coverlayers may also be deposited over the patterned conductive layers in some applications. Other variations, e.g., drilling after plating, will be apparent to one of ordinary skill in the art.

As shown in FIG. 2, an adhesive layer 40 is preferably interposed between boards 20, 30. Layer 40 preferably is a dried and cured B-stage layer formed of a plurality of nonconductive gauge particles 44 interspersed in a nonconductive adhesive 42. Alternatively, the layer may be deposited on one of the printed circuit boards via screen printing, roll coating or another suitable process. The adhesive 42 used in layer 40 is preferably a nonconductive thermosetting adhesive such as polyimide, epoxy, butyrl phenolic, etc. and combinations thereof. Other adhesives such as pressure sensitive and thermoplastic adhesives may also be used in the alternative. The adhesive used should have suitable adhesive and flow characteristics, and may also be selected based upon concerns such as dielectric constant and temperature resistance. The adhesive used in the preferred embodiment is a polyimide thermosetting adhesive, which has a dielectric constant of about 4.4 (measured at 1 Mhz under 4.8.3.1.4. of Mil-P-13949 Std.), and which is also high temperature resistant.

The gauge particles are preferably non-compactible spherical particles formed of solid or hollow non-conductive material such as glass, polymer, silica, ceramic, etc. The material used for the particles may also be selected based upon a specific dielectric strength to tailor the adhesive layer to a controlled dielectric constant. In addition, through the use of low dielectric constant particles, the overall dielectric constant of the adhesive layer may be decreased below that of the adhesive itself. The particles may also have different geometries than spherical. In the preferred embodiment, the particles are hollow glass spheres. Using the preferred size and distribution ranges for the particles, this results in an overall dielectric constant for the adhesive layer of about 1.5 to 3 (measured at 1 Mhz under 4.8.3.1.4. of Mil-P-13949 Std.).

The sizes of the particles are preferably controlled to be substantially the same throughout the adhesive layer, with preferably at least 30 percent of the particles being between about +/−10 percent of a mean diameter. Moreover, the loading or distribution of particles in the adhesive is preferably about 30 to 75 percent by volume, although other particle densities may be required in different applications, particularly where the particles are used to define the separations between other types of printed circuit layers. In addition, the final separation distances, the layouts of the boards, and other considerations may also impact the sizes and distributions of the particles in the adhesive.

In use, the particles are preferably dispersed uniformly throughout the adhesive, then the adhesive is layered, dried and cured to form a B-stage adhesive layer. The layer is then interposed between the printed circuit boards, and the entire assembly is laminated under heat and pressure to compress the boards together, as shown in FIG. 3. Under lamination, the gauge particles are trapped between the circuit boards to abut the opposing insulating layers at areas where there are no conductive layers. In areas where one or more conductive layers are present, the particles are typically displaced to areas having no conductive layers (i.e., "exposed areas" of the insulating substrates). In addition, the adhesive flows into the recesses between the boards, and any excess adhesive is squeezed out of the sides of the assembly. The extent to which the boards are compressed together during lamination is determined by the diameters of the gauge particles, as these particles abut opposing printed circuit layers to define the final layer separations for the assembly.

As noted above, the mean diameter for the population of particles is preferably selected to provide controlled separation between printed circuit layers. For example, for the embodiment shown in FIGS. 1–3, the diameter of the particles d is preferably selected to control the connected distance x between insulating substrates 22 and 32 (best seen in FIG. 3). By virtue of the substantially nondeformable nature of substrates 22, 32, controlling the distance between these layers also indirectly controls the distance y between the conductive layers 26, 36.

In many controlled impedance applications, it may be desirable to include relatively constant separations between the conductive layers in each layer of a multilayer assembly. For example, for printed circuit assembly 10, may be desirable to set the distance y between conductive layers across the adhesive layer to equal the distance z between conductive layers across the insulating substrates. For a typical assembly, e.g., including 50 micron polyimide substrates patterned with 15 micron copper layers, the mean diameter of the gauge particles would need to be 80 microns to provide a 50 micron separation between conductive layers across the adhesive layer. It may also be desirable to match the dielectric constant of the adhesive layer with that of the insulating substrates.

Figure 4:
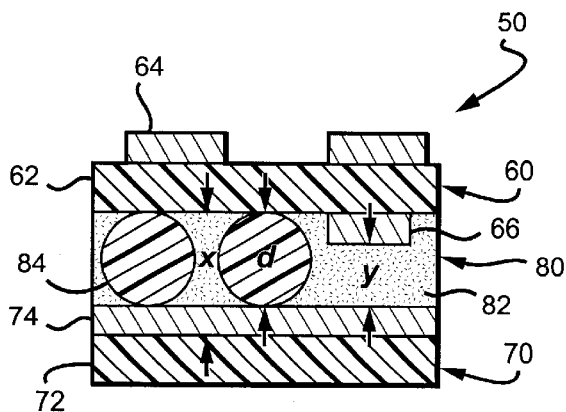
FIG. 4 is a cross-sectional view of an alternate preferred printed circuit assembly to that of FIGS. 1–3, where gauge particles are disposed between an insulating substrate and a conductive layer.

As stated above, however, the gauge particles are not limited to abutting opposing insulating substrates. For example, FIG. 4 illustrates an assembly 50 having an adhesive layer 80 (having gauge particles 84 disposed in an adhesive 82) for bonding together a pair of printed circuit boards 60, 70, with insulating substrates 62, 72 and conductive layers 64, 66, 74. In this embodiment, the plurality of gauge particles 84 abut, on printed circuit board 60, the insulating substrate 62; and on printed circuit board 70, the conductive layer 74. Again, the diameters d of the particles are controlled to indirectly set the distance y between the conductive layers 66, 74, as well as the distance x between the insulating substrates 62, 72. During lamination, the particles are displaced from any areas having two layers of overlapping conductive material. The configuration shown in FIG. 4 may be useful in applications having ground, power or shield planes where conductive material fully covers a surface of at least one printed circuit board.

Figure 5:
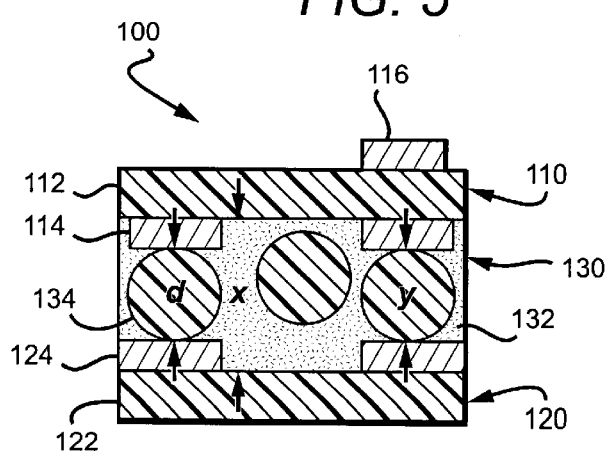
FIG. 5 is a cross-sectional view of an alternate preferred printed circuit assembly to that of FIGS. 1–3, where gauge particles are disposed between a pair of conductive layers.

As another example, FIG. 5 illustrates an assembly 100 having an adhesive layer 130 (having gauge particles 134 disposed in an adhesive 132) for bonding together a pair of printed circuit boards 110, 120, with insulating substrates 112, 122 and conductive layers 114, 116, 124. In this 124. In this configuration, the diameters d of the particles are controlled to directly set the distance y between the conductive layers 114, 124, as well as to indirectly set the distance x between the insulating substrates 112, 122. Any particles disposed in areas without any overlapping conductive material tend to "float" within the adhesive and not control layer separation. In addition, due to the non conductive nature of the particles, they do not conduct 10 across the adhesive layer and cause any potential undesired short circuits in the assembly. Consequently, a significant advantage is attained in that controlled mechanical separation is provided between conductive layers without introducing undesired conductive paths through the adhesive layer. Moreover, coverlayers are often not required, thereby reducing manufacturing costs and complexities, as well as overall assembly thicknesses.

Other printed circuit layers may abut the gauge particles, including any coverlayers formed over the 20 conductive layers on a circuit board. Additional printed circuit boards may also be bonded together using additional adhesive layers, e.g., to produce multilayer assemblies having five or more conductive layers. In addition, a dielectric material may be "filled in" between circuit 25 traces to provide a more planar surface for the printed circuit boards, whereby the gauge particles would abut two types of layers on the same printed circuit board.

Further, it may be desirable to utilize otherwise open areas of the insulating substrates ("non-signal transmitting 30 areas"—that is, those areas where conductive material would otherwise not be used) to pattern conductive material which assists in controlling separation in these areas. The conductive material in these non-signal transmitting areas may serve no other purpose than controlling separation, or it may be used as shielding or other purposes, for example.

Moreover, different particle sizes may be used in different areas of an assembly, e.g., if a ground or shield plane is only provided in one area of an assembly, and the particles and/or adhesive may be used in only some overlapping portions of the circuit boards. In addition, other manners of depositing an adhesive layer and compressing the assembly may also be used. Other modifications will be apparent to one skilled in the art.

The preferred adhesive layers may also include pad interconnecting means for electrically connecting any contact pads on the printed circuit boards at discrete locations across the adhesive layers. Any number of manners may be used to form conductive areas through an adhesive layer.

Figure 6:
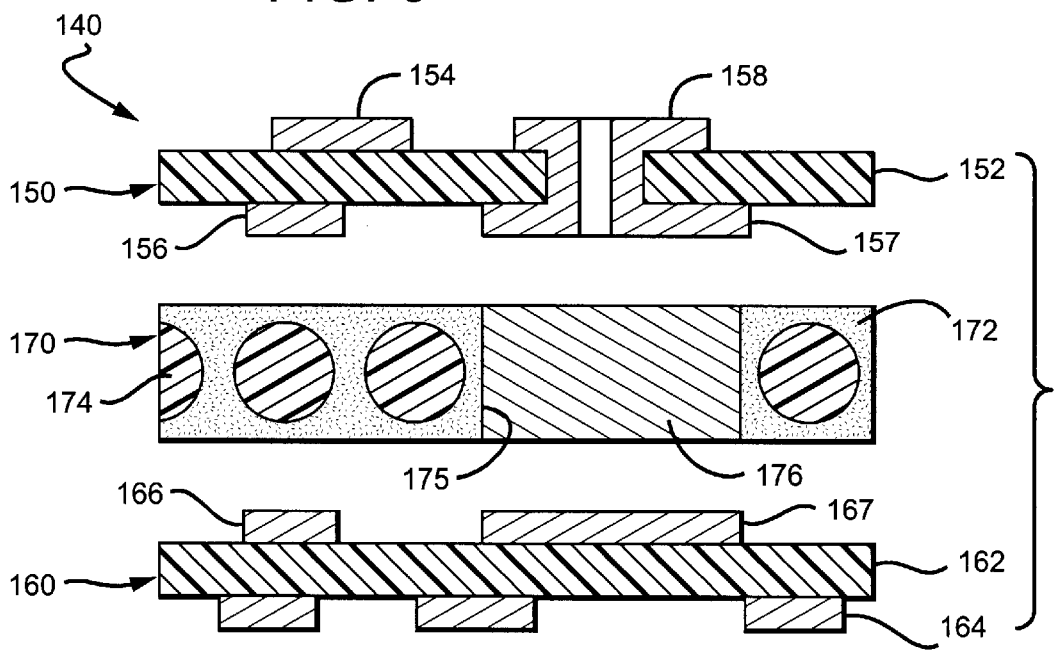
FIG. 6 is an exploded cross-section view of another alternate printed circuit assembly to that of FIGS. 1–3, where a conductive plug is formed in the adhesive layer to electrically connect opposing contact pads.
Figure 7:
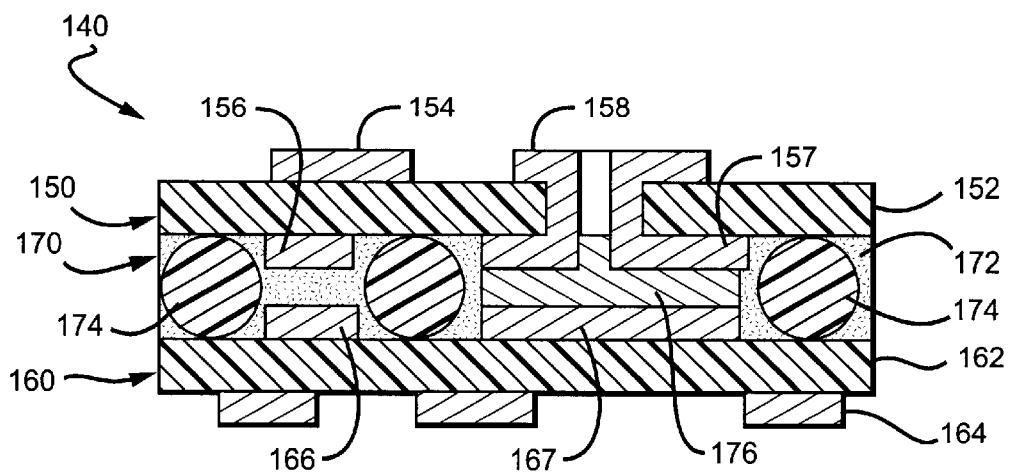
FIG. 7 is a cross-section view of the alternate printed circuit assembly of FIG. 6.

One preferred manner is to form deformable and/or fusible conductive "plugs" in an adhesive layer prior to lamination. For example, printed circuit assembly 140 of FIGS. 6 and 7 illustrates one manner of forming pad connections whereby an aperture 175 is formed in an adhesive layer 170 (having gauge particles 174 in an adhesive 172) and filled with conductive material 176. The resulting layer is interposed between a pair of printed circuit boards 150, 160 (with substrates 152, 162 and conductive layers 154, 156, 164, 166), with the conductive material 176 in layer 170 aligned with opposing pads 157 (e.g., formed at a through hole 158) and 167. When the assembly is laminated (FIG. 7), conductive material 176 preferably fuses with pads 157, 167 to form a reliable interconnection therebetween concurrent with the placement of particles 174 between substrates 152, 162.

Apertures 175 in layer 170 may be formed by drilling, punching, stamping, laser ablation, etc. Conductive material 176 may be deposited in the apertures by a number of processes, including electroplating, screen printing, ink jet printing, etc. The conductive material may be a metal such as copper, or may be a conductive ink (cured or uncured) or a fusible material such as solder particles. Two preferred manners include screen printing a fusible conductive ink, and ink jet printing fine solder particles.

Other manners of forming interlayer interconnections, e.g., drilling and plating through holes after lamination, may also be used without departing from the spirit and scope of the invention.

Therefore, it may be seen that the preferred embodiments of the invention realize controlled separation between printed circuit layers, be they insulating substrates, conductive layers, other layers, or combinations thereof. The controlled separation benefits circuit design in controlled impedance applications, since the impedances across the adhesive layers may be reliably determined. Moreover, the planarity of the resulting assemblies is improved, which is particularly important as the number of layers in an assembly increases since planarity errors are additive as the number of layers increases. This has the added advantage of maintaining relatively constant elevations of mounting pads on external surfaces of an assembly to which electronic devices such as integrated circuits are attached. Other modifications may be made to these preferred embodiments without departing from the spirit and scope of the invention.

Alternate Interlayer Interconnection

As noted above, a second aspect of the invention is directed to forming an interlayer interconnection between opposing conductive layers in a printed circuit assembly, in particular by forming conductive "posts" or similar structures on one of the printed circuit boards which are bonded with a pad on the other printed circuit board. This second aspect of the invention is particularly suitable for use in conjunction with providing controlled separation using an adhesive layer in the manner disclosed herein. However, it will be appreciated that this interlayer interconnection process may also be used across other dielectric layers, as will be set forth below.

Figure 8:
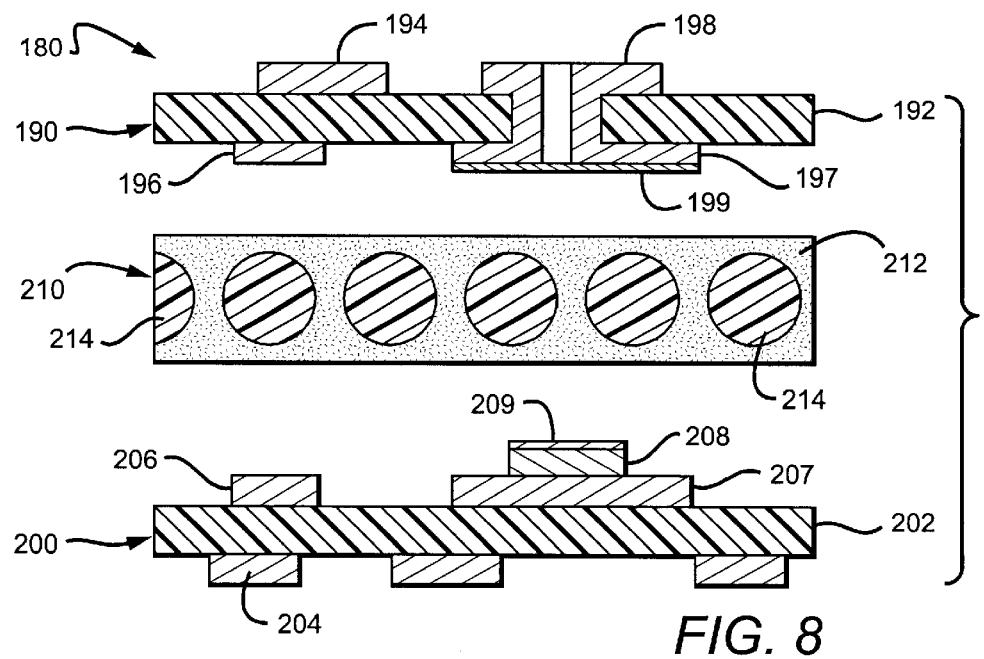
FIG. 8 is an exploded cross-section view of another alternate printed circuit assembly to that of FIGS. 1–3, where a conductive post projects through the adhesive layer to electrically connect opposing contact pads.
Figure 9:
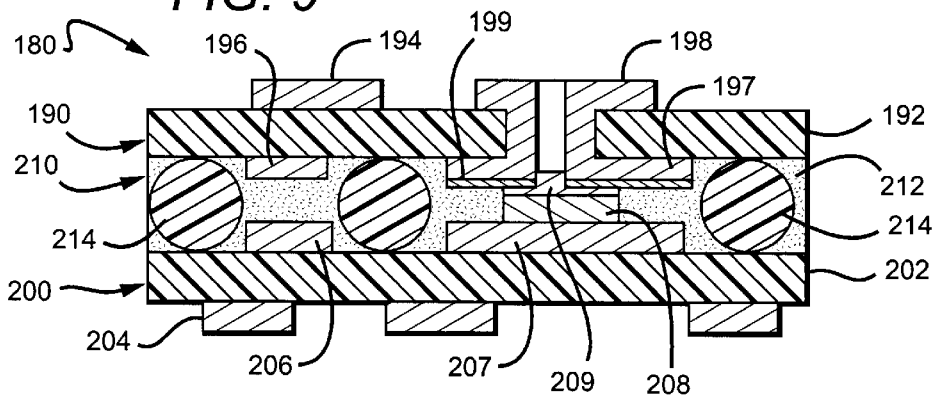
FIG. 9 is a cross-section view of the alternate printed circuit assembly of FIG. 8.

For example, printed circuit assembly 180 of FIGS. 8 and 9 illustrates a manner of forming interlayer pad connections whereby a first printed circuit board 200, with a pair of conductive layers 204, 206 formed on an insulating substrate 202, has a conductive post formed on a contact pad 207. The post is comprised of a copper layer 208 coated by a fusible material 209 such as tin. The copper and tin are preferably deposited by electroplating using a semi- additive process, although other processes, including subtractive and additive metal deposition processes, screen printing processes, stencil printing processes (e.g., stenciling conductive ink coupled with subsequent curing/sintering of the ink), etc. may also be used. Other conductive materials such as any number of binary and tertiary metals, fusible materials, and combinations thereof may be used for layer 208.

With one preferred process, a layer of dry film photoresist is applied over a copper foil printed circuit board, then the photoresist is imaged with the desired circuit through pattern over the pattern circuit pattern and developed, and copper is electroplated the resulting mask to form the desired circuit pattern. Next, a second layer of photoresist is applied first layer and is exposed and developed with the of the conductive posts to be formed on the printed. The posts are electroplated to thickness with copper, then capped by an electrodeposited layer of tin. The photoresist is stripped off and the excess copper is etched away.

The thickness to which copper layer 208 on each post is plated is primarily dependent upon the desired connected distance between the opposing contact pads, and when used in conjunction with gauge particle-filled adhesive, is dependent upon the diameters of the particles. For example it may be desirable to provide connected distances between pads in the range of about 1 to 4 mils (50 to 100 microns), with the thickness of copper layer 208 preferably being in a similar range. Tin layer 209 is preferably immersion, electroless or electroplated to a thickness selected to provide sufficient material for forming a fused connection between copper layer 208 and the opposing contact pad, preferably in the range of about 8 to 50 microinches.

The posts can also have different profiles, e.g., circular, rectangular, etc. Moreover, the maximum width or diameter of the posts may be selected depending upon resistance requirements, current handling capability, and contact pad size, typically in the range of about 50 to 100 microns. The posts, however, typically do not require any additional surface area on a board beyond the contact pads to which they are mounted, and they are preferably about ½ the diameter of the contact pads to allow for some misalignment. Accordingly, in preferred embodiments, the posts generally do not significantly impact the overall pitch (i.e., the minimum combined signal trace spacing and width) of the board.

Printed circuit board 200 is preferably interconnected via lamination to a second board 190 (with conductive layers 194, 196 formed on a substrate 192) across an adhesive layer 210 (with gauge particles 214 in an adhesive 212). Prior to lamination, it may be desirable to deposit, e.g., by immersion, electroless or electroplating, an adhesion promoting layer 199 over the contact pads, e.g., pad 197. Layer 199 may be, for example, about 8 to 50 microinches in thickness, and formed of gold or a similar material that promotes adhesion with a fusible metal such as tin layer 209. The adhesion promoting layer may also not be necessary in some applications.

During lamination (FIG. 9), the post formed of layers 208, 209 may "pierce" through layer 210 and contact pad 197 (shown at through hole 198) formed on board 190. Fusible layer 209 preferably reflows and fuses to the gold layer 199 over pad 197 to form a reliable electrical interconnect with pad 207. Due to the high unit load of the posts, they will generally displace the adhesive to permit the fusible layers to fully contact the opposing pads and form the fused connections therebetween. Also due to their high unit load, the posts also displace the gauge particles during the lamination process as shown in FIG. 9. With further compression, the gauge particles in the adhesive layer begin to share a portion of the applied, resulting in both controlled separation and reliable interconnects in the finished assembly.

Alternatively, as above with other interlayer interconnections, apertures may be drilled or formed in adhesive layer 210 with the apertures aligned with the posts, as opposed to the posts forming their own apertures.

As was mentioned previously, the post interlayer interconnection technology disclosed herein may also be used to form interconnections across other dielectric layers. For example, as shown in the assembly 220 of FIG. 10, a pair of printed circuit boards 230 and 240 may be interconnected across a dielectric layer 250 with a post having copper layer 244 and fusible material 246, formed on board 240, and fused to board 230. Dielectric layer 250 preferably includes an aligned aperture 256 through which the post may project.

Figure 10:
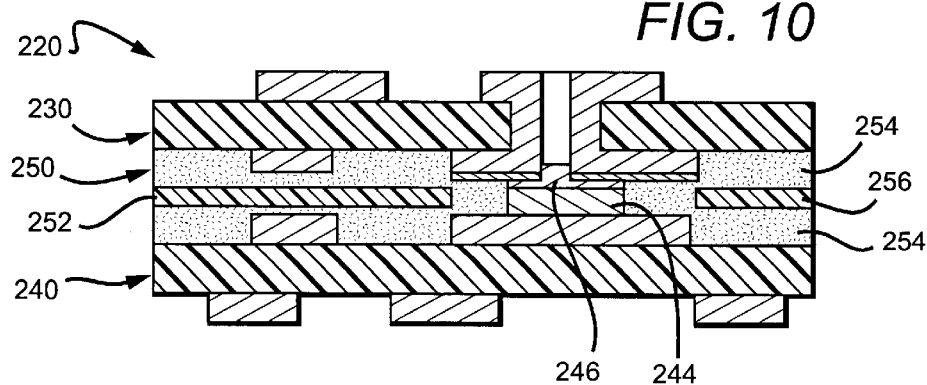
FIG. 10 is a cross-section view of another alternate printed circuit assembly to that of FIGS. 8–9, whereby an alternate dielectric layer is disposed between opposing printed circuit boards.

Numerous dielectric layer constructions may be used to bond boards 230 and 240 together. For example, as shown in FIG. 10, dielectric layer 250 may include a base dielectric film 252 coated on both sides with an adhesive 254. Alternatively, the dielectric film may be a prepreg composition of woven glass impregnated with adhesives. Other dielectric layers, such as non-woven glass and film tapes, etc., or any other form of dielectric layer suitable for bonding opposing boards to one another may also be used.

It is also possible to utilize a dielectric layer having a base film or sheet with a predetermined grid or pattern of apertures at known locations. Through proper circuit design, posts may be located to be aligned with apertures, thereby eliminating the need to specially drill a dielectric layer.

It is believed that the use of interconnecting posts in the manner disclosed herein provides reliable interlayer interconnects in a simple, reliable and cost effective manner. Moreover, the posts may be constructed with fine dimensions and spacing, thereby increasing the obtainable packaging density for a printed circuit assembly. In addition, the posts are capable of forming intermetallic joints, which are typically much more reliable than adhesive joints due to the metallurgical interaction of such joints. The posts also have the benefit of being deposited using standard photolithographic techniques at generally the same resolution of the overall circuit patterns, and they also reduce material costs because discrete conductive interconnections may be made only at desired locations on the boards. Further, the posts may be made smaller than the contact pads to which they are connected, thereby allowing for some misalignment of the pads during lamination. Other benefits will be appreciated by one skilled in the art.

Other changes and modifications may be made to the preferred embodiments without departing from the spirit and scope of the invention. Therefore, the invention lies in the claims hereinafter appended.

What is claimed is:

1. A printed circuit assembly, comprising first and second printed circuit layers, each printed circuit layer including an insulating substrate with a conductive layer disposed thereon, the conductive layer on the first printed circuit layer including a first contact pad opposing a second contact pad on the conductive layer on the second printed circuit layer;

a dielectric layer comprising one dielectric film layer sandwiched between two adhesive layers, the dielectric layer disposed between the first and second printed circuit layers, and including an aperture extending through the dielectric film layer and aligned between the first and second contact pads; and a conductive post having a diameter smaller than that of the aperture extending through the dielectric film layer of the dielectric layer, the post extending through the aperture and forming fused connections with the first and second contact pads, a portion of the conductive post extending into at least one of the first or second contact pads.

2. The printed circuit assembly of claim 1, wherein the dielectric layer includes a grid of apertures, and wherein the conductive post is aligned with one of the apertures in the grid of apertures.

3. The printed circuit assembly of claim 1, wherein the conductive post has a width which is smaller than the widths of the first and second contact pads.

4. The printed circuit assembly of claim 1, wherein the conductive post comprises a first metal layer formed on the first contact pad and a second metal layer formed on the first metal layer, the second metal layer comprising a fusible metal that is fused with the second contact pad.

5. The printed circuit assembly of claim 4, wherein the first metal layer comprises copper and the second metal layer comprises tin.

6. The printed circuit assembly of claim 4, wherein the second contact pad comprises an adhesion promoting layer deposited thereon and fused with the second metal layer on the conductive post.

7. The printed circuit assembly of claim 6, wherein the adhesion promoting layer comprises gold deposited to a thickness in the range of about 8 to 50 microinches.

8. The printed circuit assembly of claim 1, wherein the first and second circuit layers are spaced using a plurality of gauge particles.

9. The printed assembly of claim 1, wherein the fused connections are fused using a conductive ink.

10. The printed assembly of claim 1, wherein the conductive post comprises a conductive ink.

11. A printed circuit assembly, comprising:

first and second printed circuit layers, each printed circuit layer including an insulating substrate with a conductive layer disposed thereon, the conductive layer on the first printed circuit layer including a first contact pad opposing a second contact pad on the conductive layer on the second printed circuit layer;

a dielectric layer disposed between the first and second printed circuit layer and comprising a dielectric film coated on two opposite sides with an adhesive for bonding the first and second printed circuit boards to one another, the adhesive adhering to both the first contact pad and the second contact pad, and the dielectric layer including an aperture extending and aligned between the first and second contact pads and through the dielectric film layer, and the aperture having a diameter measurably larger than that of the conductive post; and a conductive post extending through the aperture and forming fused connections with the first and second contact pads.

12. A printed circuit assembly, comprising:

first and second printed circuit layers, each printed circuit layer including an insulating substrate with a conductive layer disposed thereon, the conductive layer on the first printed circuit layer including a first contact pad opposing a second contact pad on the conductive layer on the second printed circuit layer;

a dielectric layer disposed between the first and second printed circuit layer and comprising a prepreg sheet filled with an adhesive for bonding the first and second printed circuit boards to one another, the adhesive adhering to both the first contact pad and the second contact pad, and the dielectric layer including an aperture extending and aligned between the first and second contact pads and through the prepreg sheet, and the aperture having a diameter measurably larger than that of the conductive post; and a conductive post extending through the aperture and forming fused connections with the first and second contact pads.

* * * * *